United States Patent
Chen et al.

(10) Patent No.: US 10,398,226 B2
(45) Date of Patent: Sep. 3, 2019

(54) BRACKET ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chi-Chih Chou, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 157 days.

(21) Appl. No.: 15/346,123

(22) Filed: Nov. 8, 2016

(65) Prior Publication Data

US 2017/0215585 A1 Aug. 3, 2017

(30) Foreign Application Priority Data

Jan. 29, 2016 (TW) .............................. 105102999 A

(51) Int. Cl.
A47B 88/43 (2017.01)
H05K 7/14 (2006.01)

(52) U.S. Cl.
CPC ........... *A47B 88/43* (2017.01); *H05K 7/1489* (2013.01)

(58) Field of Classification Search
CPC ............................ A47B 88/044; H05K 7/1489

USPC ............ 211/26; 248/220.21, 220.41, 220.31, 248/221.11, 298.1; 312/334.1, 334.4, 312/334.5

See application file for complete search history.

(56) References Cited

U.S. PATENT DOCUMENTS

| | | | | |
|---|---|---|---|---|
| 3,054,511 A | * | 9/1962 | Erismann | A47B 57/485 108/108 |
| 5,833,337 A | * | 11/1998 | Kofstad | H05K 7/1421 312/334.5 |
| 6,230,907 B1 | | 5/2001 | Stuart | |
| 6,929,339 B1 | * | 8/2005 | Greenwald | H05K 7/1421 211/26 |
| 7,699,279 B2 | * | 4/2010 | Chen | A47B 88/43 248/220.22 |
| 7,857,145 B2 | * | 12/2010 | Mushan | A47B 88/43 211/26 |
| 7,878,468 B2 | * | 2/2011 | Chen | A47B 88/43 211/26 |

(Continued)

FOREIGN PATENT DOCUMENTS

| | | | | |
|---|---|---|---|---|
| DE | 202014100424 U1 | 2/2014 | | |
| EP | 2547187 A2 | * 1/2013 | ........... | H05K 7/1489 |

(Continued)

*Primary Examiner* — Kimberly T Wood
(74) *Attorney, Agent, or Firm* — Rosenberg, Klein & Lee

(57) ABSTRACT

A bracket assembly includes a bracket, a mounting member, a supporting member, and a fixing member. The mounting member and the supporting member are mounted on the bracket. The supporting member includes a first supporting portion and a second supporting portion. The first supporting portion is larger in size than the second supporting portion. A mounting hole communicates with the first supporting portion and the second supporting portion. A portion of the fixing member can be mounted to the mounting hole.

7 Claims, 9 Drawing Sheets

(56) References Cited

U.S. PATENT DOCUMENTS

| | | | | |
|---|---|---|---|---|
| 7,950,753 B2* | 5/2011 | Liang | | A47B 88/43 |
| | | | | 211/26 |
| 7,988,246 B2* | 8/2011 | Yu | | A47B 88/43 |
| | | | | 211/175 |
| 8,562,086 B1 | 10/2013 | Baik | | |
| 8,596,471 B2* | 12/2013 | Chen | | H05K 7/1421 |
| | | | | 211/153 |
| 8,727,138 B2 | 5/2014 | Dittus et al. | | |
| 8,870,311 B2* | 10/2014 | Chang | | H05K 7/1489 |
| | | | | 312/334.4 |
| 8,967,565 B2* | 3/2015 | Chen | | A47B 88/044 |
| | | | | 211/192 |
| 8,967,567 B2* | 3/2015 | Chen | | H05K 7/1489 |
| | | | | 211/192 |
| 9,125,489 B2* | 9/2015 | Chen | | A47B 88/43 |
| 9,363,921 B1* | 6/2016 | Chen | | H05K 7/1489 |
| 9,370,120 B2* | 6/2016 | Chen | | A47B 96/025 |
| 9,375,087 B1* | 6/2016 | Chen | | A47B 88/43 |
| 9,402,475 B2* | 8/2016 | Gu | | A47B 88/044 |
| 9,480,183 B2* | 10/2016 | Chen | | H05K 7/1489 |
| 9,642,281 B1* | 5/2017 | Chen | | H05K 7/1489 |
| 9,723,924 B1* | 8/2017 | Chiu | | A47B 88/43 |
| 2003/0234602 A1* | 12/2003 | Cutler | | A47B 88/43 |
| | | | | 312/333 |
| 2004/0104184 A1* | 6/2004 | Hartman | | G06F 1/183 |
| | | | | 211/26 |
| 2005/0156493 A1* | 7/2005 | Yang | | H05K 7/1489 |
| | | | | 312/334.5 |
| 2008/0296455 A1* | 12/2008 | Brock | | A47B 96/06 |
| | | | | 248/298.1 |
| 2008/0304903 A1* | 12/2008 | Huang | | H05K 7/1489 |
| | | | | 403/230 |
| 2009/0114785 A1* | 5/2009 | Huang | | H05K 7/1489 |
| | | | | 248/220.31 |
| 2009/0167127 A1* | 7/2009 | Chen | | A47B 88/43 |
| | | | | 312/334.1 |
| 2010/0200523 A1* | 8/2010 | Henderson | | H05K 7/1489 |
| | | | | 211/26 |
| 2012/0018605 A1* | 1/2012 | Lacarra | | H05K 7/1489 |
| | | | | 248/224.8 |
| 2012/0175477 A1* | 7/2012 | Tang | | H05K 7/1489 |
| | | | | 248/222.14 |
| 2012/0292274 A1* | 11/2012 | Lin | | A47B 88/43 |
| | | | | 211/86.01 |
| 2013/0032678 A1* | 2/2013 | Chen | | H05K 7/1421 |
| | | | | 248/224.8 |
| 2013/0056432 A1* | 3/2013 | Lin | | H05K 7/1489 |
| | | | | 211/123 |
| 2014/0117180 A1* | 5/2014 | Chen | | H05K 7/1489 |
| | | | | 248/219.1 |
| 2014/0363108 A1* | 12/2014 | Chen | | A47B 88/044 |
| | | | | 384/22 |
| 2014/0363109 A1* | 12/2014 | Chen | | A47B 88/43 |
| | | | | 384/22 |

FOREIGN PATENT DOCUMENTS

| | | |
|---|---|---|
| JP | 2006202792 A | 8/2006 |
| JP | 2012129517 A | 7/2012 |
| TW | I331428 B | 10/2010 |

\* cited by examiner

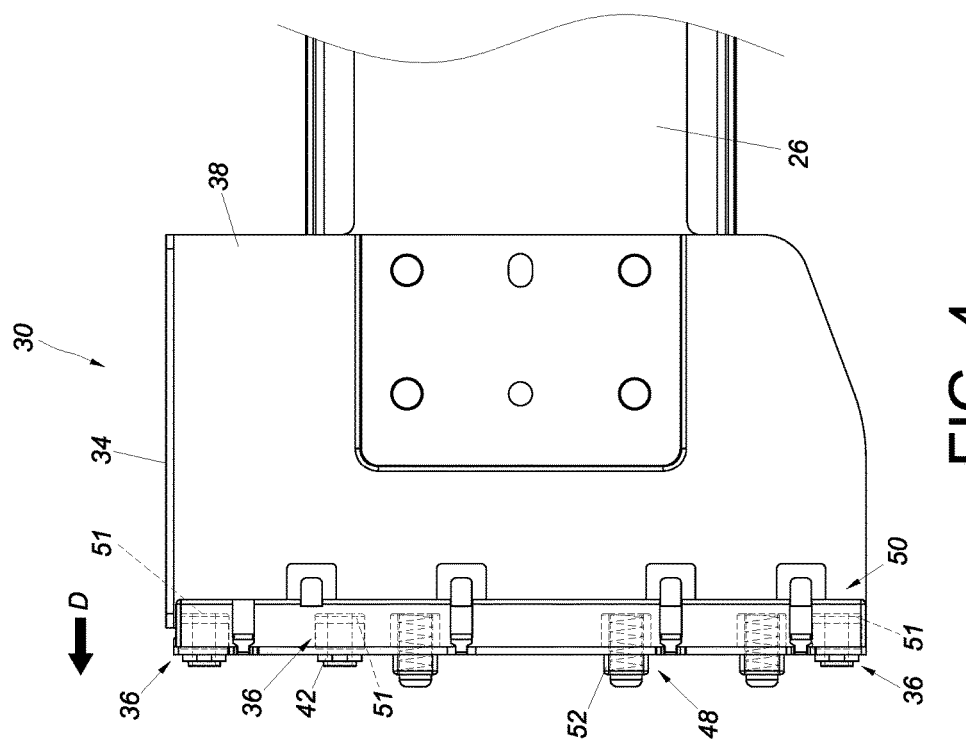
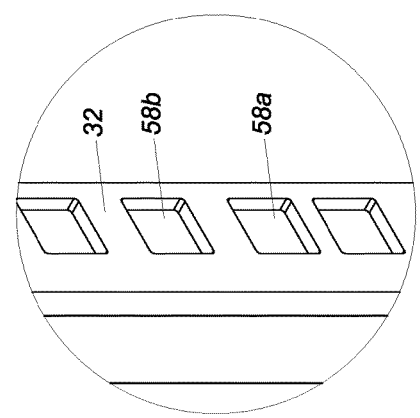
FIG. 4
FIG. 5

BRACKET ASSEMBLY

FIELD OF THE INVENTION

The present invention relates to a bracket assembly and more particularly to one configured to be mounted to a post of a rack.

BACKGROUND OF THE INVENTION

Generally, a rack-based system includes a slide rail assembly mounted on a rack via a bracket. U.S. Pat. No. 8,727,138 B2, for instance, discloses a toolless rail enabling simplified installation and removal. According to FIG. 1 and FIG. 2 accompanying the specification of this US patent, a rail (10) can be mounted to a vertical rack rail (20) through a latch assembly (30), wherein the latch assembly (30) includes two retractable pins (42, 44), two latch arms (52, 54), and two threaded elements (34, 36), all six of which are configured to correspond to and/or be mounted to a plurality of holes (22) of the vertical rack rail (20) respectively. As shown in FIG. 7A of the specification of the US patent, once the two retractable pins (42, 44) and the two latch arms (52, 54) are mounted in their respective holes (22), two optional threaded fasteners can be used to lock with the two threaded elements (34, 36) respectively, thereby locking the latch assembly (30) to the vertical rack rail (20).

More specifically, as can be known from FIG. 7A of the specification of the afore-cited patent, the holes (22) of the vertical rack rail (20) are larger in size than the two threaded elements (34, 36) (e.g., threaded holes). Therefore, after the two threaded fasteners are respectively inserted into the threaded elements (34, 36), the walls of the corresponding holes (22) of the vertical rack post (20) do not provide physical support for the threaded fasteners, leaving something to be desired in the structural strength of the entire assembly

SUMMARY OF THE INVENTION

The present invention relates to a bracket assembly configured to be mounted on a post in a well-supported manner.

According to one aspect of the present invention, a bracket assembly includes a bracket, at least one mounting member, and a supporting member. The bracket includes a side plate and an end plate substantially perpendicularly connected to the side plate. The at least one mounting member is mounted on the end plate of the bracket. The supporting member is also mounted on the end plate of the bracket. Preferably, the bracket device is adapted for mounting a slide rail to a post, and the bracket is mountable on the slide rail, wherein the mounting member is configured to be mounted to a first hole of the post while the supporting member has at least a portion configured to be inserted into a second hole of the post.

In some embodiments, the supporting member includes a first supporting portion, a second supporting portion, and a mounting hole. The first supporting portion is larger in size than the second supporting portion. The mounting hole is preferably in communication with the first supporting portion and the second supporting portion. The supporting member can be mounted with the post by inserting either one of the first supporting portion and the second supporting portion of the supporting member into the second hole of the post, and a fixing member can be subsequently mounted to the mounting hole to fix the bracket assembly to the post.

In some embodiments, the bracket assembly includes a base mounted on the bracket, and the base provides a receiving space, in which the supporting member is mounted. The first supporting portion of the supporting member has a length less than the depth of the receiving space of the base so that the supporting member can be adjusted, or more specifically displaced, with respect to the base.

In some embodiments, the second supporting portion of the supporting member extends from the first supporting portion.

In some embodiments, one of the first supporting portion and the second supporting portion of the supporting member is a circular or rectangular post.

In some embodiments, the mounting hole is a threaded hole configured to lock with the fixing member.

BRIEF DESCRIPTION OF THE DRAWINGS

FIG. 4 shows how the bracket assembly according to an embodiment of the present invention is mounted to a post with rectangular holes;

FIG. 5 is a partial perspective view of the post in FIG. 4;

DETAILED DESCRIPTION OF THE INVENTION

Figure 1:
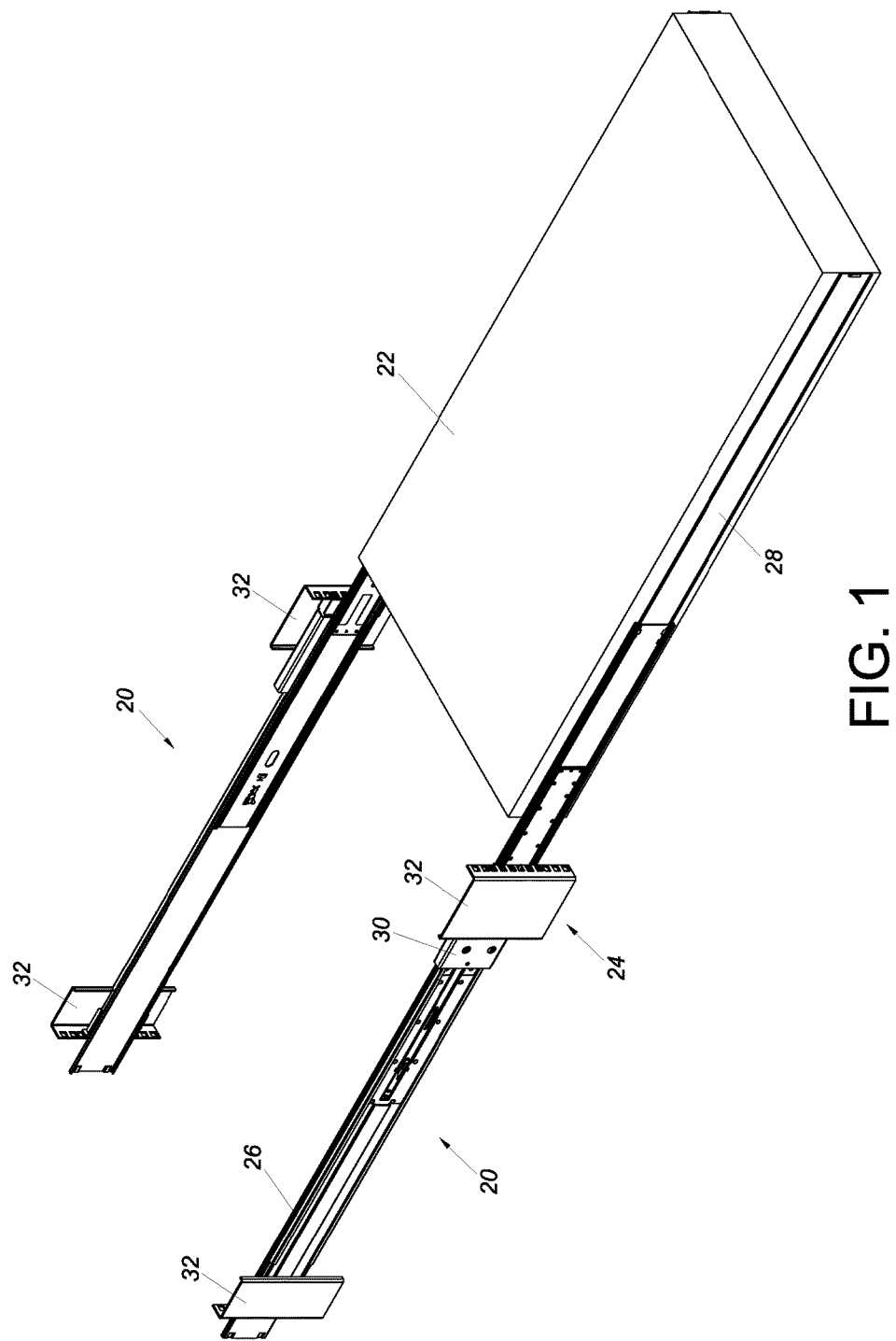
FIG. 1 is a perspective view showing how a pair of slide rail assemblies mount an object to a rack via a pair of bracket assemblies according to an embodiment of the present invention.

According to an embodiment of the present invention, referring to FIG. 1, a pair of slide rail assemblies 20 can be used to mount an object 22 to a rack 24. More specifically, each slide rail assembly 20 includes a first rail 26 and a second rail 28, wherein the first rail 26 can be mounted to one of the plural posts 32 of the rack 24 via a bracket assembly 30, and the second rail 28 is configured to carry the object 22 and can be displaced with respect to the first rail 26 in order to enter an extended state. The foregoing arrangement is well known in the art and therefore will not be further dealt with herein.

Figure 2:
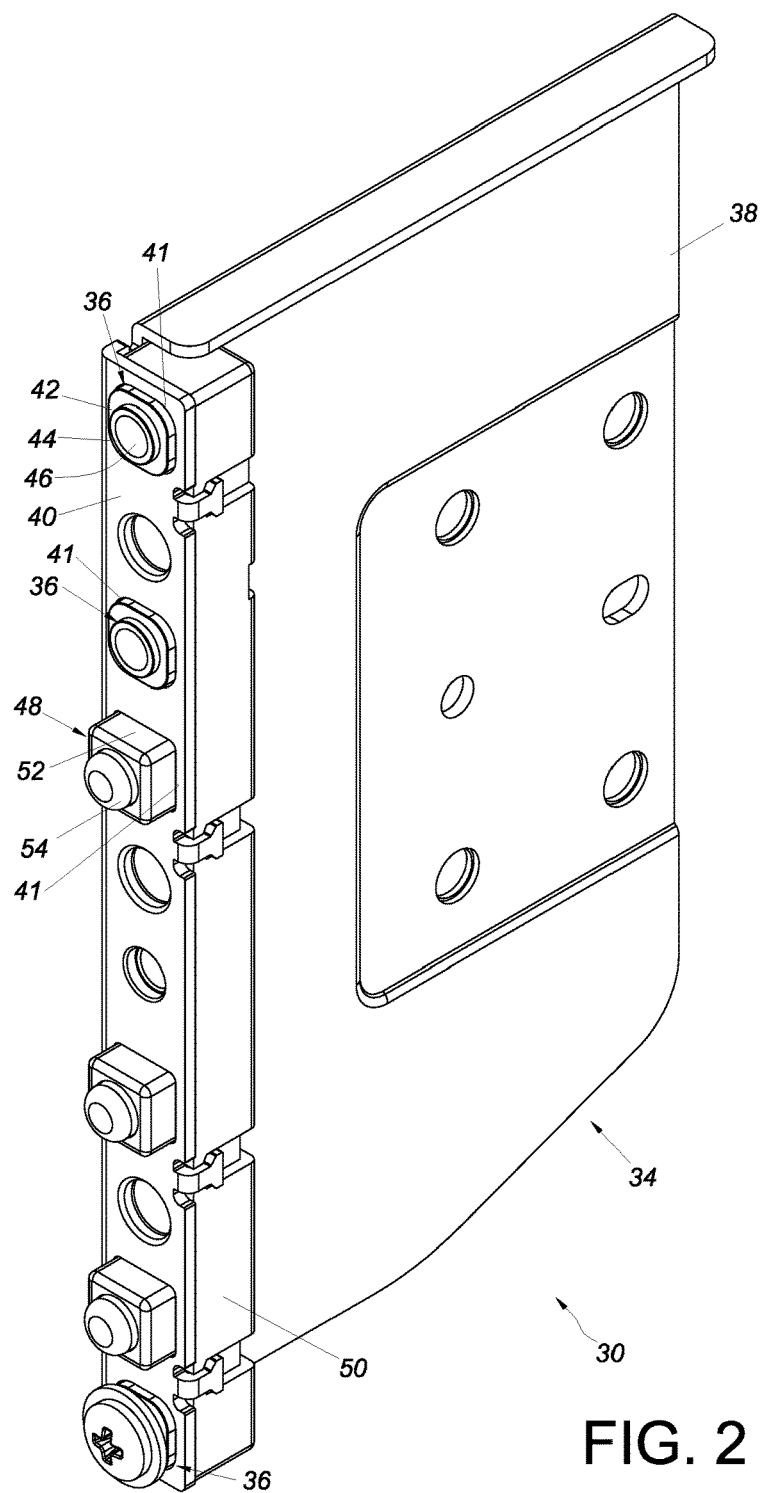
FIG. 2 is an assembled perspective view of the bracket assembly according to an embodiment of the present invention.
Figure 3:
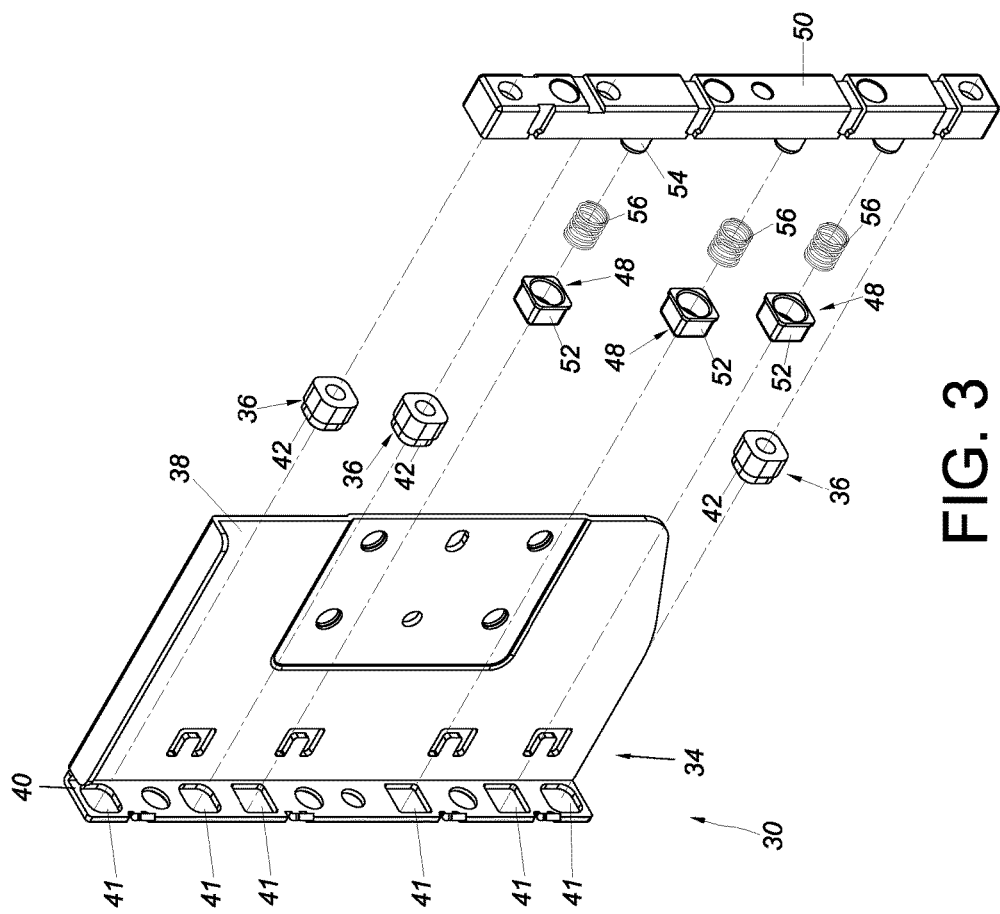
FIG. 3 is an exploded perspective view of the bracket assembly according to an embodiment of the present invention.

As shown in FIG. 2 and FIG. 3, the bracket assembly 30 includes a bracket 34 and at least one supporting member 36. The bracket 34 has a side plate 38 and an end plate 40 substantially perpendicularly connected to the side plate 38. The end plate 40 has a plurality of end holes 41. In this embodiment, three supporting members 36 are provided by way of example. Each supporting member 36 is mounted on the bracket 34 (e.g., on the end plate 40 of the bracket 34) and partially extends through a corresponding one of the end holes 41 of the end plate 40. Each supporting member 36 includes a first supporting portion 42 and a second supporting portion 44, wherein the first supporting portion 42 is larger in size than the second supporting portion 44. Each supporting member 36 also has a mounting hole 46, which in this embodiment is in communication with the first supporting portion 42 and the second supporting portion 44. In each supporting member 36, the second supporting portion 44 extends a certain distance from the first supporting portion 42, and one of the first supporting portion 42 and the second supporting portion 44 is a circular or rectangular post. In this embodiment by way of example, the first supporting portion 42 of each supporting member 36 is a rectangular post while the second supporting portion 44 of each supporting member 36 is a circular post. In other embodiments, however, the first supporting portion 42 and the second supporting portion 44 of each supporting member 36 may both be circular posts or rectangular posts.

The bracket assembly 30 further includes at least one mounting member 48 and a base 50. In this embodiment, three mounting members 48 are provided by way of example. Each mounting member 48 is mounted on the bracket 34 (e.g., on the end plate 40 of the bracket 34) and extends through a corresponding one of the end holes 41 of the end plate 40. The base 50 is also mounted on the bracket 34, and all the mounting members 48 and supporting members 36 are mounted to the end plate 40 of the bracket 34 via the base 50. Preferably, each mounting member 48 includes a first mounting portion 52, a second mounting portion 54, and an elastic member 56 mounted between the first mounting portion 52 and the base 50. In each mounting member 48, the second mounting portion 54 is connected to the base 50, and the first mounting portion 52 is larger in size than and is mounted around the second mounting portion 54. Moreover, each supporting member 36 can be adjusted, or more specifically displaced, with respect to the base 50.

Referring to FIG. 4 and FIG. 5, the base 50 provides a receiving space 51 for each supporting member 36, and the supporting members 36 are mounted in the receiving spaces 51 respectively. The bracket 34 is mounted on the first rail 26 and in this embodiment is mounted on the first rail 26 via the side plate 38. The first rail 26, in turn, is mounted on the post 32 via the bracket 34. The post 32 has a plurality of holes, which are of the same size and include a plurality of first holes 58a and a plurality of second holes 58b for example. The first holes 58a and the second holes 58b are rectangular holes. The first mounting portion 52 of each mounting member 48 is slightly smaller in size than the first holes 58a, whereas the first supporting portion 42 of each supporting member 36 is slightly smaller in size than the second holes 58b.

Figure 6:
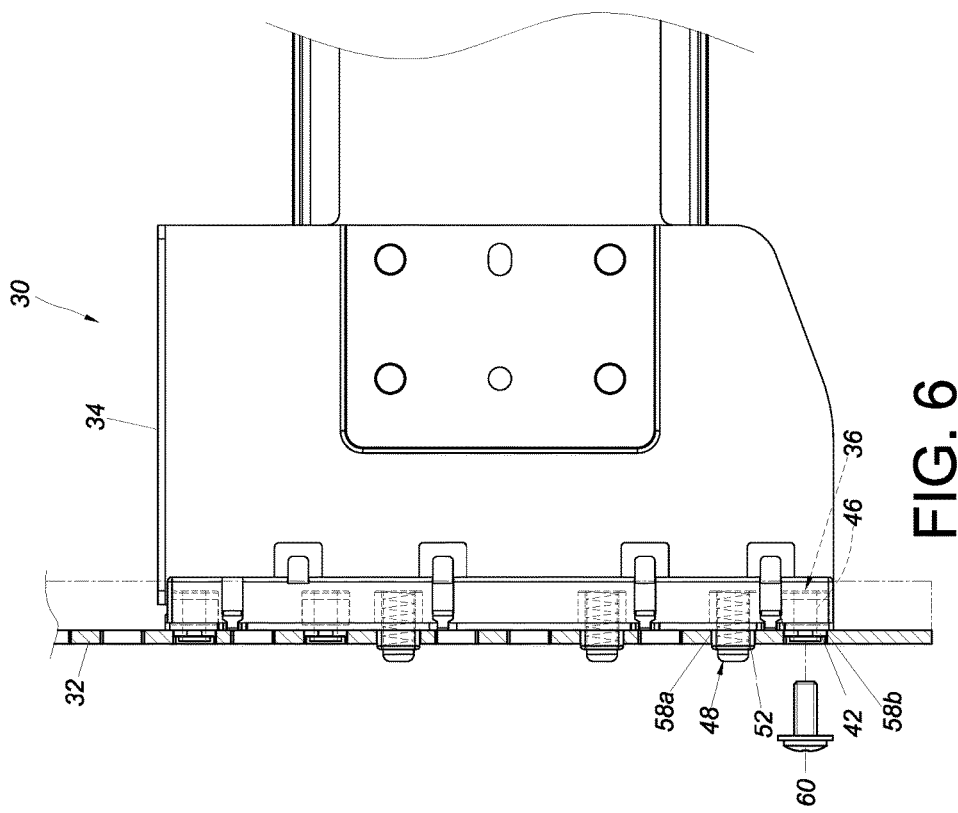
FIG. 6 shows the bracket assembly according to an embodiment of the present invention mounted on the post in FIG. 4 and also shows how the bracket assembly can be locked to the post by at least one fixing member.

During the mounting process, referring to FIG. 6, the bracket 34 is mounted to the post 32 such that the first mounting portions 52 of the mounting members 48 are mounted in the first holes 58a respectively. On the other hand, the supporting members 36 are respectively and at least partially inserted into the second holes 58b. In this embodiment, it is the first supporting portion 42 of each supporting member 36 that enters the corresponding second hole 58b. Preferably, a plurality of fixing members 60 are also included and are configured to be mounted to the mounting holes 46 of the supporting members 36 respectively and thereby fix the bracket assembly 30 to the post 32. Each mounting hole 46 may be a threaded hole configured to lock with any of the fixing members 60 (e.g., threaded members). Alternatively, each mounting hole 46 may be a through hole, and in that case each fixing member 60 is passed partially through the through hole of the corresponding supporting member 36 and then locks with a nut (not shown) to fix the bracket assembly 30 to the post 32.

Figure 7:
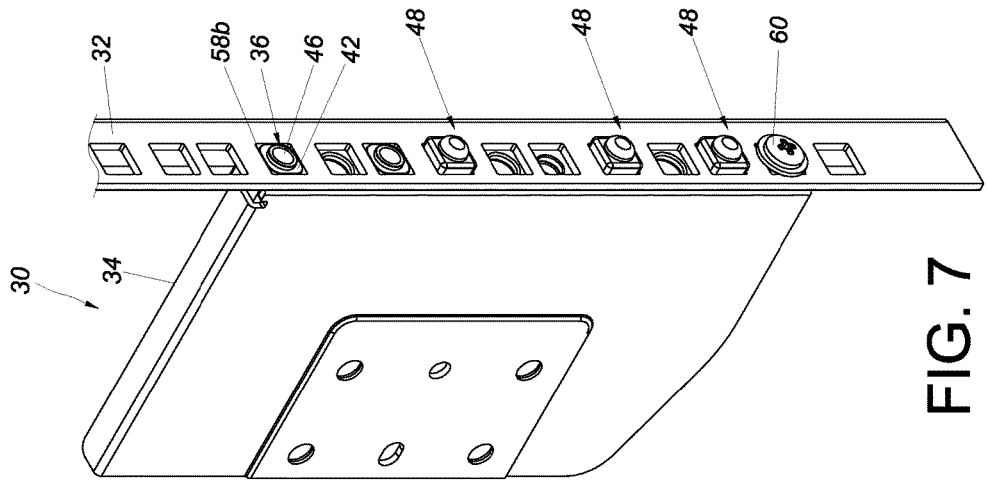
FIG. 7 is a perspective view showing the bracket assembly according to an embodiment of the present invention mounted on the post in FIG. 4.

As shown in FIG. 7, the bracket assembly 30 not only is mounted on the post 32 via the three mounting members 48, but also gains additional support through the three supporting members 36, each having at least a portion (e.g., the first supporting portion 42) inserted in the corresponding second hole 58b of the post 32. More specifically, each first supporting portion 42 is confined by the wall (e.g., a rectangular wall) of the corresponding second hole 58b of the post 32 once inserted in the corresponding second hole 58b, and this helps increase the structural strength of the entire assembly composed of the post 32 and the bracket 34 mounted thereon. By additionally inserting a portion of each fixing member 60 into the corresponding mounting hole 46, the bracket assembly 30 is further fixed to the post 32, and the bracket 34 is securely held in the upward, downward, leftward, and rightward directions.

Figure 8:
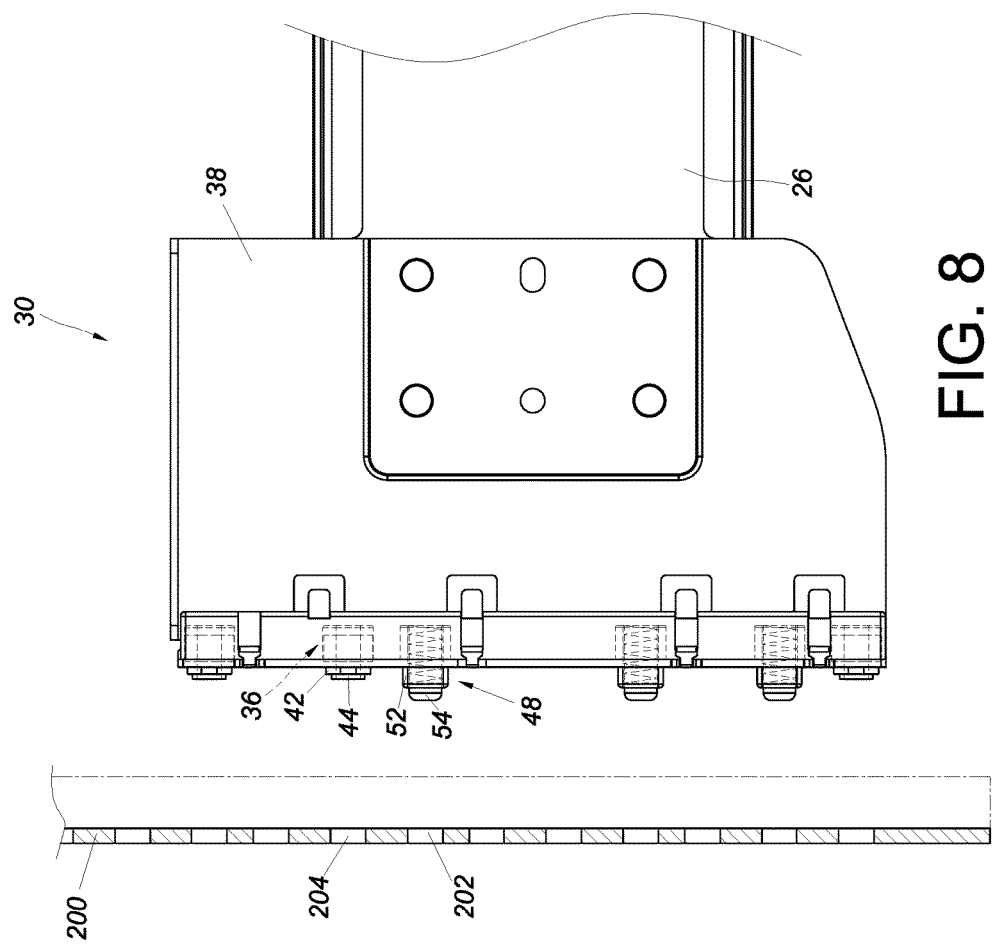
FIG. 8 shows how the bracket assembly according to an embodiment of the present invention is mounted to another post with circular holes.
Figure 9:
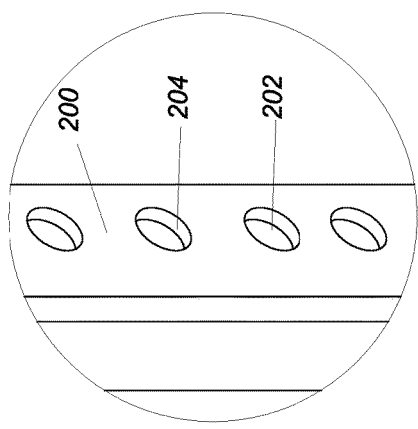
FIG. 9 is a partial perspective view of the post in FIG. 8.

Referring to FIG. 8 and FIG. 9, the bracket assembly 30 also can be mounted to a post 200. The post 200 has a plurality of holes, which are of the same size and include a plurality of first holes 202 and a plurality of second holes 204 for example. The first holes 202 and the second holes 204 are circular holes. The second mounting portion 54 of each mounting member 48 is slightly smaller in size than the first holes 202 while the first mounting portion 52 of each mounting member 48 is larger in size than the first holes 202. The second supporting portion 44 of each supporting member 36 is lightly smaller in size than the second holes 204 while the first supporting portion 42 of each supporting member 36 is larger in size than the second holes 204.

Figure 10:
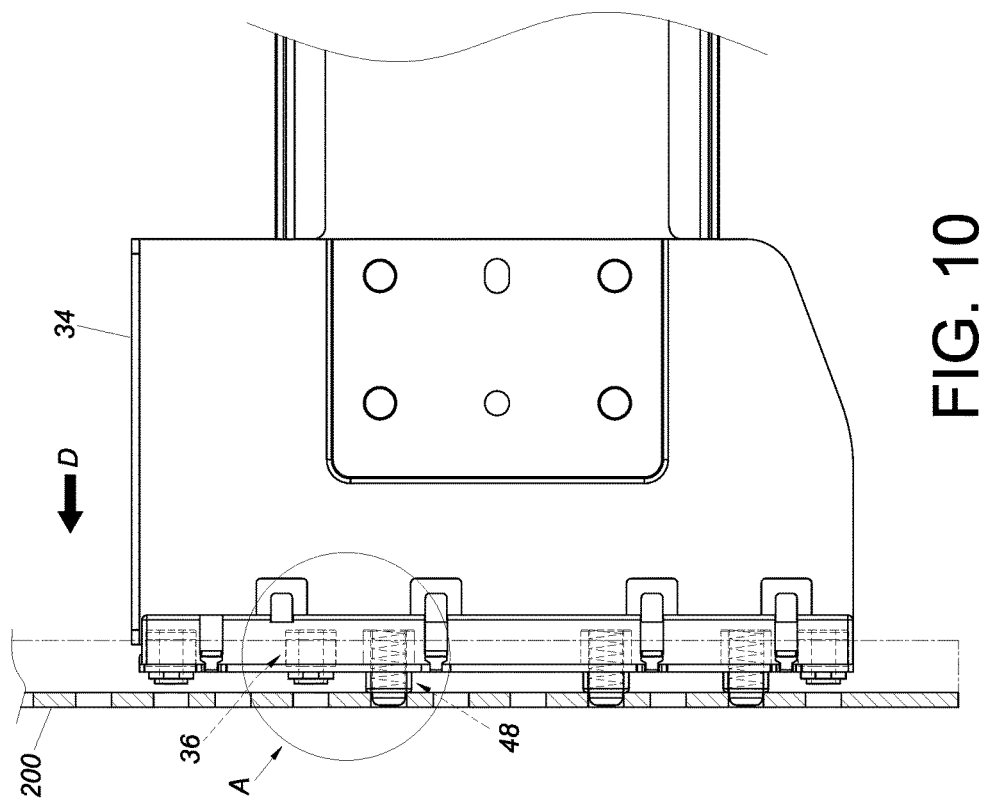
FIG. 10 shows the bracket assembly in FIG. 8 further displaced toward the post.
Figure 11:
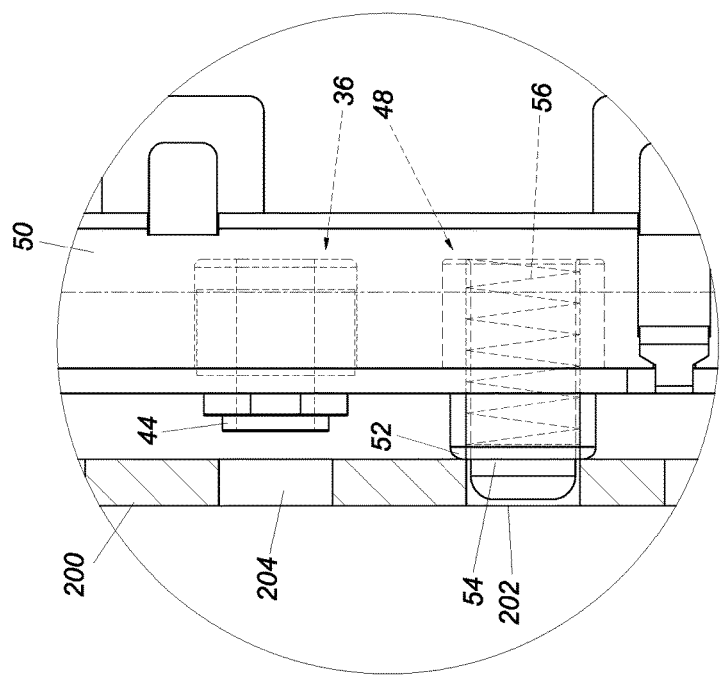
FIG. 11 is an enlarged view of the circled area A in FIG. 10.

In each mounting member 48, as shown in FIG. 10 and FIG. 11, the elastic member 56 applies an elastic force to the first mounting portion 52, and the first mounting portion 52 extends out of the base 50 in response to the elastic force of the elastic member 56. During the mounting process, the bracket 34 is displaced in a direction D toward the post 200 such that the second mounting portions 54 of the mounting members 48 enter the first holes 202 respectively. However, the first mounting portions 52 of the mounting members 48 are too large to enter the first holes 202 respectively and are therefore pressed against the post 200. The second supporting portions 44 of the supporting members 36, on the other hand, are respectively aligned with the second holes 204.

Figure 12:
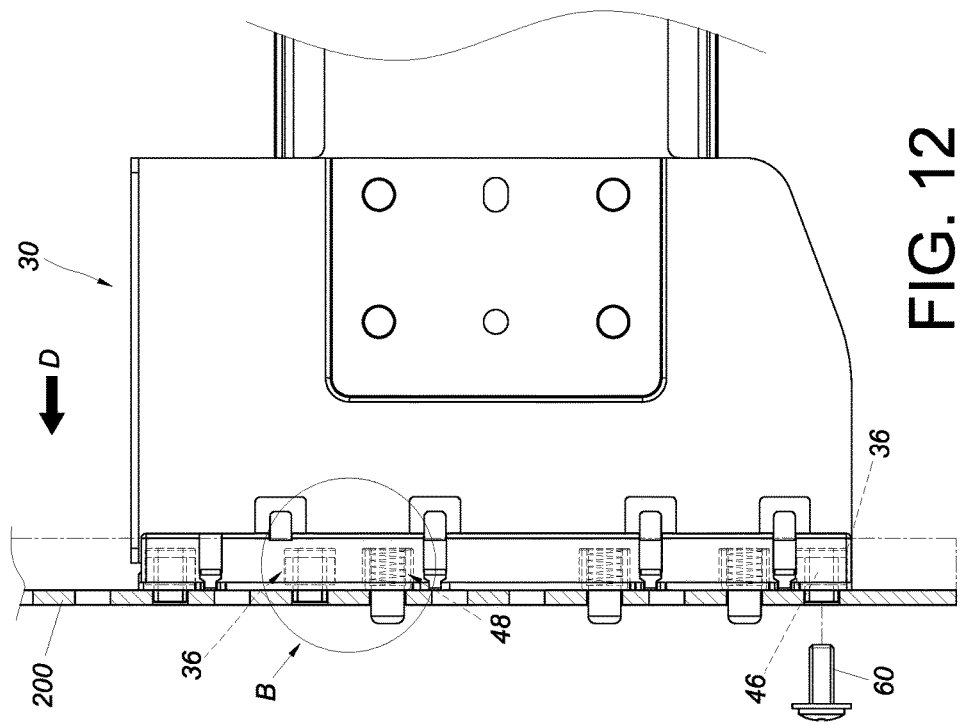
FIG. 12 shows the bracket assembly according to an embodiment of the present invention mounted on the post in FIG. 8 and also shows how the bracket assembly can be locked to the post by at least one fixing member.
Figure 13:
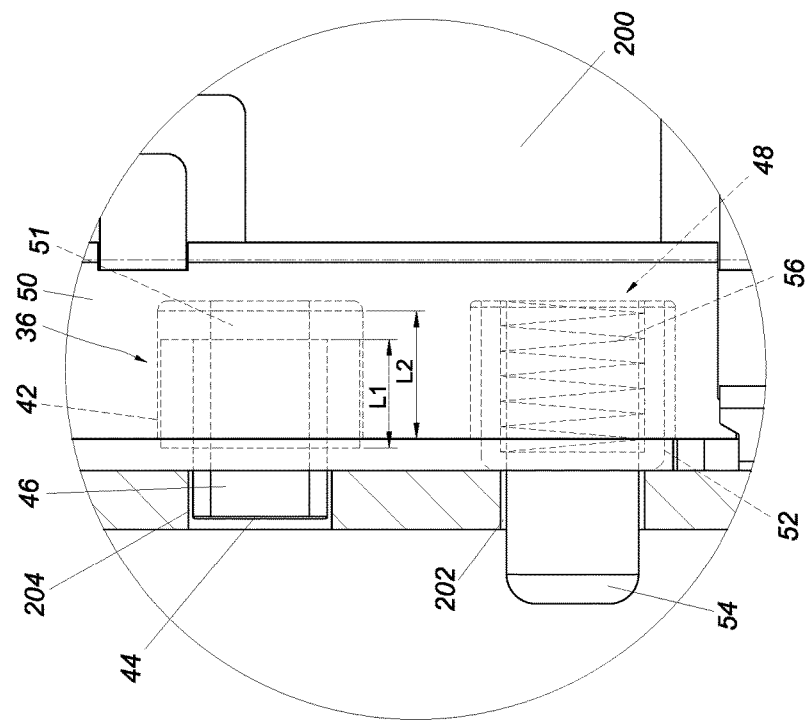
FIG. 13 is an enlarged view of the circled area B in FIG. 12.

Referring to FIG. 12 and FIG. 13, when the bracket assembly 30 is further displaced in the direction D toward the post 200, the first mounting portions 52 of the mounting members 48 are displaced with respect to the second mounting portions 54 in the opposite direction of the direction D thanks to the elastic members 56. The elastic members 56, in turn, are compressed by the first mounting portions 52 respectively and each store an elastic force while the second mounting portions 54 of the mounting members 48 are mounted into the first holes 202 respectively. As to the supporting members 36, they are at least partially inserted into the second holes 204 respectively, and in this embodiment it is the second supporting portions 44 of the supporting members 36 that are respectively inserted into the second holes 204. Preferably, the first supporting portion 42 of each supporting member 36 has a length L1 less than the depth L2 of each receiving space 51 of the base 50 so that the supporting members 36 can be adjusted, or more specifically displaced, with respect to the base 50. Moreover, the bracket assembly 30 can be further fixed to the post 200 by inserting the fixing members 60 into the mounting holes 46 of the supporting members 36 respectively.

Figure 14:
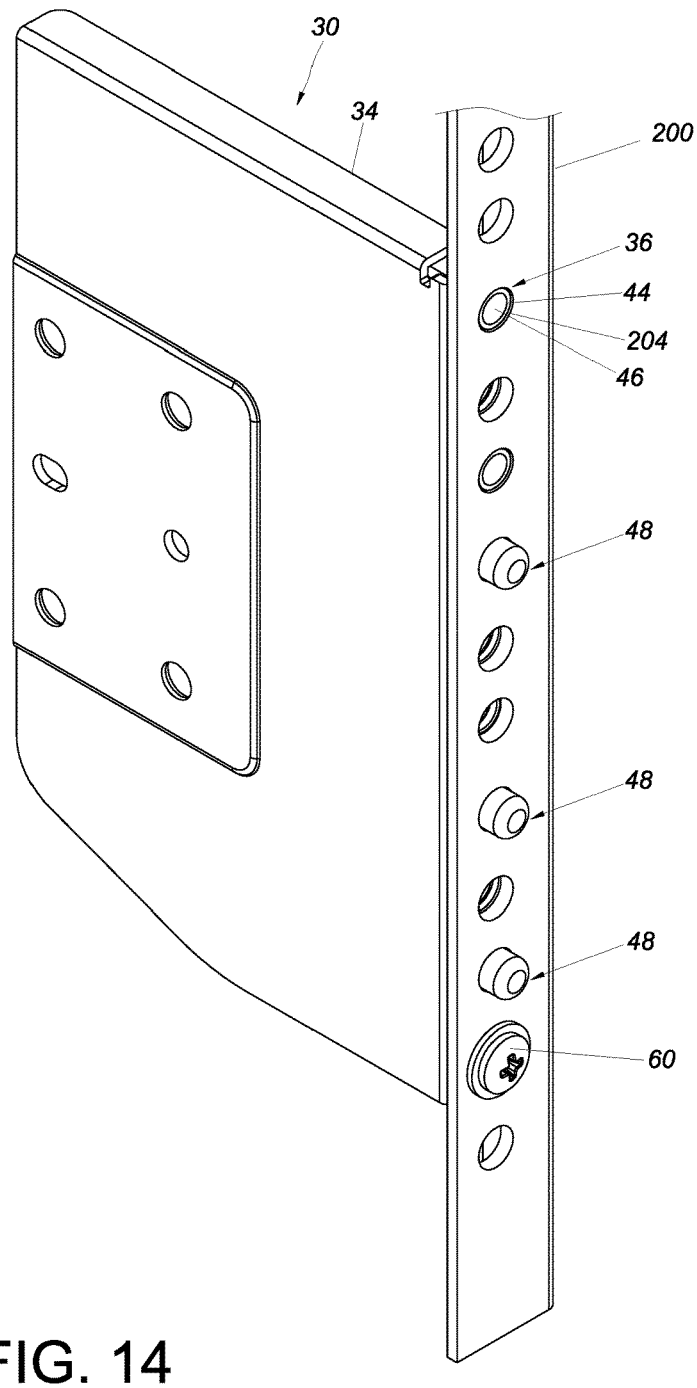
FIG. 14 is a perspective view showing the bracket assembly according to an embodiment of the present invention mounted on the post in FIG. 8.

As shown in FIG. 12 and FIG. 14, the bracket assembly 30 not only is mounted on the post 200 via the three mounting members 48, but also gains additional support through the three supporting members 36, each having at least a portion (e.g., the second supporting portion 44) inserted in the corresponding second hole 204 of the post 200. More specifically, each second supporting portion 44 is confined by the wall (e.g., a circular wall) of the corresponding second hole 204 of the post 200 once inserted in the corresponding second hole 204, and this helps increase the structural strength of the entire assembly composed of the post 200 and the bracket 34 mounted thereon. By additionally mounting the fixing members 60 to the mounting holes 46 respectively, the bracket assembly 30 is further locked to the post 200, and the bracket 34 is firmly held in the upward, downward, leftward, and rightward directions.

According to the above, implementation of the present invention has the following features: Firstly, the mounting members 48 of the bracket 34 are configured to be inserted into and hence supported by the post 32, 200. Secondly, and more importantly, the supporting members 36 can be inserted respectively and at least partially into the corresponding holes of the post 32, 200 to keep the bracket assembly 30 securely mounted on the post 32, 200. Thirdly, the fixing members 60 can be used to lock the bracket assembly 30 to the post 32, 200, thereby providing additional support to the bracket 34 in the upward, downward, leftward, and rightward directions, rendering the bracket assembly 30 well supported in vibration tests, and ensuring the safety of use of the object 22 (e.g., a chassis) carried by the slide rail assemblies 20. Last but not least, each supporting member 36 has two supporting portions 42, 44 configured to cope with the differently shaped (e.g., rectangular or circular) holes of various posts.

While the present invention has been disclosed through the foregoing preferred embodiment, it should be understood that the embodiment are not intended to be restrictive of the invention. The scope of patent protection sought by the applicant is defined by the appended claims.

What is claimed is:

1. A bracket assembly adapted for mounting a slide rail to a post, the bracket assembly comprising:
    a bracket mountable on the slide rail, the bracket having a side plate and an end plate substantially perpendicularly connected to the side plate;
    a base mounted on the bracket;
    a mounting member extending from the base and mounted on the end plate of the bracket, the mounting member being configured to be mounted to a first hole of the post, the mounting member being elastically biased away from the base when captured by the base against the post; and
    a supporting member extending from the base and mounted on the end plate of the bracket, the supporting member having at least a portion configured to be inserted into a second hole of the post, the supporting member including a first supporting portion, a second supporting portion, and a mounting hole in communication with the first supporting portion and the second supporting portion; the first supporting portion being larger in size than the second supporting portion; the supporting member being configured to be mounted with the post by inserting either one of the first supporting portion and the second supporting portion into the second hole of the post; and the mounting hole being a threaded hole configured to lock with the fixing member to thereby fix the bracket assembly to the post;
    wherein a fixing member engages the supporting member through the post to capture the post against the bracket.

2. The bracket assembly of claim 1, wherein the base provides a receiving space, the supporting member is mounted in the receiving space, and the first supporting portion of the supporting member has a length less than a depth of the receiving space of the base such that the supporting member is displaceable with respect to the base.

3. The bracket assembly of claim 1, wherein the second supporting portion of the supporting member extends from the first supporting portion.

4. The bracket assembly of claim 1, wherein one of the first supporting portion and the second supporting portion of the supporting member is a circular or rectangular post.

5. A bracket assembly, comprising:
    a bracket including a side plate and an end plate substantially perpendicularly connected to the side plate;
    a base mounted on the bracket;
    at least one mounting member extending from the base and mounted on the end plate of the bracket, the mounting member being elastically biased away from the base when captured by the base against a post;
    a supporting member extending from the base and mounted on the end plate of the bracket, the supporting member including a first supporting portion, a second supporting portion, and a mounting hole, the first supporting portion being larger in size than the second supporting portion; and
    a fixing member configured to be mounted to the mounting hole, the mounting hole being a threaded hole configured to lock with the fixing member and the fixing member thereby engaging the supporting member through the post to capture the post against the bracket.

6. The bracket assembly of claim 5, wherein the second supporting portion of the supporting member extends from the first supporting portion.

7. The bracket assembly of claim 5, wherein one of the first supporting portion and the second supporting portion of the supporting member is a circular or rectangular post.

* * * * *